(12) United States Patent
McCauley et al.

(10) Patent No.: US 6,828,770 B1
(45) Date of Patent: Dec. 7, 2004

(54) APPARATUS AND METHOD FOR ELECTRICAL MEASUREMENTS ON CONDUCTORS

(75) Inventors: Simon Francis McCauley, Newcastle (AU); David Keith Sweeting, St. Ives (AU)

(73) Assignee: CHK Wireless Technologies Australia Pty Ltd. (AU)

( * ) Notice: Subject to any disclaimer, the term of this patent is extended or adjusted under 35 U.S.C. 154(b) by 0 days.

(21) Appl. No.: 09/958,848

(22) PCT Filed: Apr. 12, 2000

(86) PCT No.: PCT/AU00/00315

§ 371 (c)(1),
(2), (4) Date: Jan. 22, 2002

(87) PCT Pub. No.: WO00/62084

PCT Pub. Date: Oct. 19, 2000

Related U.S. Application Data
(60) Provisional application No. 60/128,745, filed on Apr. 12, 1999.

(51) Int. Cl.[7] .......................... G01R 31/28; G01R 31/11
(52) U.S. Cl. .................. 324/117 R; 324/529; 324/530; 324/543
(58) Field of Search ........................ 324/117 R, 117 H, 324/72, 72.5, 543, 529, 530

(56) References Cited

U.S. PATENT DOCUMENTS

| | | | | |
|---|---|---|---|---|
| 4,266,189 A | * | 5/1981 | Karlin et al. ........... | 324/117 H |
| 4,280,182 A | * | 7/1981 | Mickowski .................. | 318/567 |
| 4,402,028 A | * | 8/1983 | Udren .......................... | 367/36 |
| 4,947,126 A | * | 8/1990 | May et al. .................... | 324/509 |
| 5,146,156 A | * | 9/1992 | Marcel .................... | 324/117 H |
| 5,473,244 A | * | 12/1995 | Libove et al. .............. | 324/126 |
| 5,493,211 A | * | 2/1996 | Baker ...................... | 324/117 H |
| 5,519,560 A | * | 5/1996 | Innes et al. .................. | 361/87 |
| 6,037,763 A | * | 3/2000 | Trontelj .................. | 324/117 H |
| 6,380,727 B1 | * | 4/2002 | Jitaru ..................... | 324/117 R |

OTHER PUBLICATIONS

Fam W. Z., "A Novel Transducer to Replace Current and Voltage Transformers in High–Voltage Measurements" Feb. 1996, IEEE Transactions on Instrumentation and Measurement, vol. 45, No. 1, pp. 190–194.*

* cited by examiner

*Primary Examiner*—N. Le
*Assistant Examiner*—Timothy J. Dole
(74) *Attorney, Agent, or Firm*—Haugen Law Firm PLLP

(57) ABSTRACT

A method for measuring at least one characteristic parameter of an alternating current in a conductor, the method including the steps of measuring the magnetic field around the conductor at a point along the conductor; deriving an analogue voltage signal representative of the measured magnetic field; amplifying the analogue voltage signal; converting the amplified voltage signal into a digital voltage signal; measuring the digital voltage signal and, when the amplitude of digital voltage signal reaches a predetermined value, adjusting a gain setting of the amplification; and generating an output signal representative of the parameter of the alternating current based on the amplified voltage signal and the gain setting.

7 Claims, 8 Drawing Sheets

APPARATUS AND METHOD FOR ELECTRICAL MEASUREMENTS ON CONDUCTORS

This application claims the benefit of Provisional application Ser. No. 60/128,745 filed Apr. 12, 1999.

Field of the Invention

This invention relates broadly to developments concerning equipment for electrical measurements on conductors. The invention will be described herein with reference to fault indicators for power distribution cables, it will be appreciated, however, that the invention does have broader applications, including for example in stand alone current measurements on electrical conductors.

BACKGROUND OF THE INVENTION

Equipment for detection and location of faults on power lines involve typically the measurement of the magnetic fields produced by the alternating current in power lines, using a single magnetic field sensing coil.

In substations, this involves expensive current transformers, which must also provide insulation between the power line conductor and earth potential.

There is also equipment which can be located throughout a network which does not provide its own insulation between the phase and earth potential because it is mounted either at phase potential or at earth potential.

Such equipment normally derives a signal proportional to the average or peak magnetic field by rectifying the waveform to produce a DC voltage and this is used for the detection and location of faults. By deriving a signal proportional to the average or peak magnetic field, other waveform parameters, phase, and harmonic content information is removed from the signal. DC voltages are suitable for analogue amplification, for operating analogue control devices and for interpretation by analogue comparators.

When the power lines experience a fault, high currents flow in the conductors of the lines, producing a rapid increase in the magnetic fields around the conductors. Therefore, if an increase is detected by the equipment, this is indicative of a fault current having passed the magnetic field sensing coil. Typically, within the equipment a derivative of the output signal of the magnetic field sensing coil is produced in an analogue electronic circuit, to detect increases in the amplitude of current flow. The currents flowing in the conductors of the power lines, particularly during a fault situation, may typically vary between 5 to 25,000 Amperes. The average magnetic field around the power line conductors therefore has a high dynamic range, which is typically between 1 to 10,000.

The types of coil which may be used to measure magnetic fields in such equipment are i) air-cored coils which are typically cylindrical, ii) air-cored toroids, iii) coils, cylindrical or toroidal, which are cored with a ferromagnetic or paramagnetic medium other than air. Each type of coil has specific advantages and disadvantages. Air-cored coils do not saturate in the presence of high magnetic fields and can therefore be used to detect magnetic fields with a high dynamic range. However, with air-cored coils, particularly cylindrical coils mounted at earth potential some distance from the power line conductor, low magnetic fields generate only low induced signals in the coil and may therefore be difficult to detect accurately, in particularly when background signals may contribute to the measurements., On the other hand, coils cored with a para- or ferromagnetic medium, increase the induced signal in the coil due to the high permeability which results in an increase of the magnetic field inside the coil due to magnetic polarisation of the medium. However, such coils have the disadvantage of saturating once the "true" magnetic field to be measured exceeds a particular value, and therefore the characteristics of fields in excess of that particular value cannot be measured with such coils.

In the equipment for detection and location of faults on power lines, the average magnetic field signal derived from the coils is processed using an analogue circuit. Some fault detectors may employ an analogue variable gain control utilising for example a variable resistor such as a Junction Field Effect Transistor (JFET) to increase the dynamic range for the measurement, however, due to the analog nature of such circuits the output signal is then not directly representative of measured magnetic field strength. In some fault detectors, such as those described in U.S. Pat. No. 4,947,126 and U.S. Pat. No. 5,270,898, a gain may be employed which is switched between a high and low value by analogue circuitry utilizing for example, switches or relays. However, due to the analogue nature of such circuits, a dynamic range of greater than 16:1 is difficult to attain and scaling of the amplitude is normally lost. The amplitude of the signal in the sensing coil and that of the output signal lose their one-to-one relationship and this cannot be restored using analogue circuitry alone.

The equipment described above has the limitation of providing little information on the magnetic field, waveform, phase or harmonic content and electric field waveform, phase or harmonic content preceding, during and after the fault, since the information utilised is substantially limited to the identification of sudden changes in the amplitude of the magnetic field detected by the magnetic field sensing coil. The further information about the magnetic field and electric field preceding, during and after the fault can be useful in determining the characteristics of the fault. These characteristics include the severity of the fault (ratio of fault current to pre-fault current), the time and duration of the fault current and the time for the protection equipment to operate, whether the fault was phase to phase or phase to earth, and whether the fault current was accompanied by a fuse or circuit breaker operation (loss of voltage) or a substantial variation in the voltage.

Furthermore, the equipment described above is not able to discriminate between a fault current and what is referred to as magnetising inrush currents, which are typically observed when voltage is applied to a non-faulted power system following an extended outage period. Therefore, when the equipment detects loss of system voltage, it usually inhibits its detection of faults until a predetermined period after voltage is reapplied, resulting in a period during which fault detection for the power line concerned is impossible.

SUMMARY OF THE INVENTION

In accordance with a first aspect of the present invention there is provided a method for measuring at least one characteristic parameter of an alternating current in a conductor, the method comprising the steps of:

measuring the magnetic field around the conductor at a point along the conductor;

deriving an analogue voltage signal representative of the measured magnetic field;

adding a direct current (DC) offset signal to an alternating current (AC) component of the measured magnetic field;

amplifying the analogue voltage signal;

converting the amplified voltage signal into a digital voltage signal;

measuring the digital voltage signal and, when the amplitude of digital voltage signal reaches a predetermined value, adjusting a gain setting of the amplification; and generating an output signal representative of the parameter of the alternating current based on the amplified voltage signal and the gain setting.

The step of adding a DC offset signal allows for making the measured magnetic field suitable for amplification while substantially maintaining waveform information.

Accordingly, in at least preferred embodiments of the present invention, a large dynamic range can be realised for the magnetic field/alternating current measurements. Preferably, the method can be used in conjunction with an air-cored coil not to be limited by a saturation effect.

The characteristic parameter of the alternating current may be one of the group of waveform characteristics of the alternating current such as amplitude of the alternating current; frequency of the alternating current; phase of the alternating current; harmonic content of the alternating current; and a derivative of the alternating current. More than one parameters may be measured simultaneously.

The method may preferably further comprise the step of integrating the analogue voltage signal for obtaining the waveform of the alternating current in the conductor.

Thereby, in at least preferred embodiments of the present invention, even low magnetic field strengths may be measured at high main settings.

In one embodiment, the step of adding a DC offset signal comprises the step of varying the DC offset signal in response to a DC component in the digital voltage signal.

In a preferred embodiment, the method further comprises the step of digitally filtering the digital voltage signal to determine the ratio of a mains voltage signal at a mains frequency of the conductor and an harmonic voltage signal at an harmonic of the mains frequency. In one embodiment, a second harmonic is utilised for determining whether a magnetic field signal around the conductor is caused by magnetising inrush current.

Preferably, the method further comprises the step of measuring an electric field in the vicinity of the conductor; and deriving a second analogue voltage signal representative of the measured electric field in the vicinity of the conductor.

In one embodiment, the step of measuring the electric field comprises the step of placing a capacitor arrangement in the vicinity of the conductor; and the method further comprises the steps of amplifying the second analog voltage signal; converting the amplified second voltage signal into a second digital voltage signal; measuring the second digital voltage signal and, if the amplitude of the second digital voltage signal reaches a second predetermined value, adjusting a second gain setting of the second amplification; and generating a second output signal representative of at least one parameter of a voltage signal in the conductor derived from the second amplified voltage signal and the second gain setting.

The characteristic parameter of the voltage signal may be one of the group of waveform characteristics of the voltage signal such as amplitude of the voltage signal; frequency of the voltage signal; phase of the voltage signal; and harmonic content of the voltage signal. More than one parameters may be measured simultaneously.

In accordance with a second aspect of the present invention there is provided an apparatus for measuring at least one characteristic parameter of an alternating current in a conductor, the apparatus comprising:

measuring means for measuring the magnetic field around the conductor at a point along the conductor;

means for deriving an analogue voltage signal representative of the measured magnetic field;

trimming means for providing a DC offset signal to an AC component of the measured magnetic field;

amplification means for amplifying the analogue voltage signal;

converting means for converting the amplified voltage signal into a digital voltage signal;

gain control means for adjusting a gain setting of the amplification depending on the amplitude of the digital voltage signal; and means for generating an output signal representative of the parameter of the alternating current based on the amplified voltage signal and the gain setting.

The trimming means allows for making the measured magnetic field suitable for amplification while substantially maintaining waveform information.

The characteristic parameter of the alternating current may be one of the group of waveform characteristic of the alternating current such as amplitude of the alternating current; frequency of the alternating current; phase of the alternating current; and harmonic content of the alternating current. More than one parameters may be measured simultaneously.

The apparatus may preferably further comprise means for integrating the analogue voltage signal to obtain the waveform of the alternating current in the conductor.

In one embodiment, the apparatus further comprises filtering means for filtering the digital signal and means for determining the ratio of a mains voltage signal at a mains frequency of the conductor and an harmonic voltage signal at an harmonic of the mains frequency.

Preferably, the apparatus further comprises a second measuring means for measuring an electric field in the vicinity of the conductor; and means for deriving a second analogue voltage signal corresponding to the measured electric field in the vicinity of the conductor.

In one embodiment, the apparatus further comprises second amplification means for amplifying the second analog voltage signal; second converting means for converting the second amplified voltage signal into a second digital voltage signal; second gain control means for adjusting a second gain setting of the second amplification means depending on the second digital voltage signal; and a second means for generating a second output signal representative of at least one parameter of a voltage signal in the conductor derived from the second amplified voltage signal and the second gain setting.

The characteristic parameter of the voltage signal may be one of the group of waveform characteristics of the voltage signal such as amplitude of the voltage signal; frequency of the voltage signal; phase content of the voltage signal; and harmonic content of the voltage signal. More than one parameters may be measured simultaneously.

The amplification, conversion, gain control and output may be performed by the same respective components for both the electric and magnetic field measurements in the apparatus.

In one embodiment, the amplification means comprises first and second operational amplifiers in series, wherein the analogue voltage signal is applied to the non-inverting input of the first operational amplifier, and the output of the first operational amplifier is connected to the non-inverting input of the second operational amplifier.

In one embodiment, the gain control means comprises a digitally controlled analogue switch having a low "off" resistance and a high "on" resistance.

Preferably, the trimming means comprises a serial to parallel shift register, wherein the outputs of the shift register are connected to a resister network to form a digital to analogue converter.

The present invention may be more readily understood from the description of preferred forms of an apparatus for electrical measurements on conductors given below with reference to the accompanying drawings.

DETAILED DESCRIPTION OF THE PREFERRED EMBODIMENT

Figure 1:
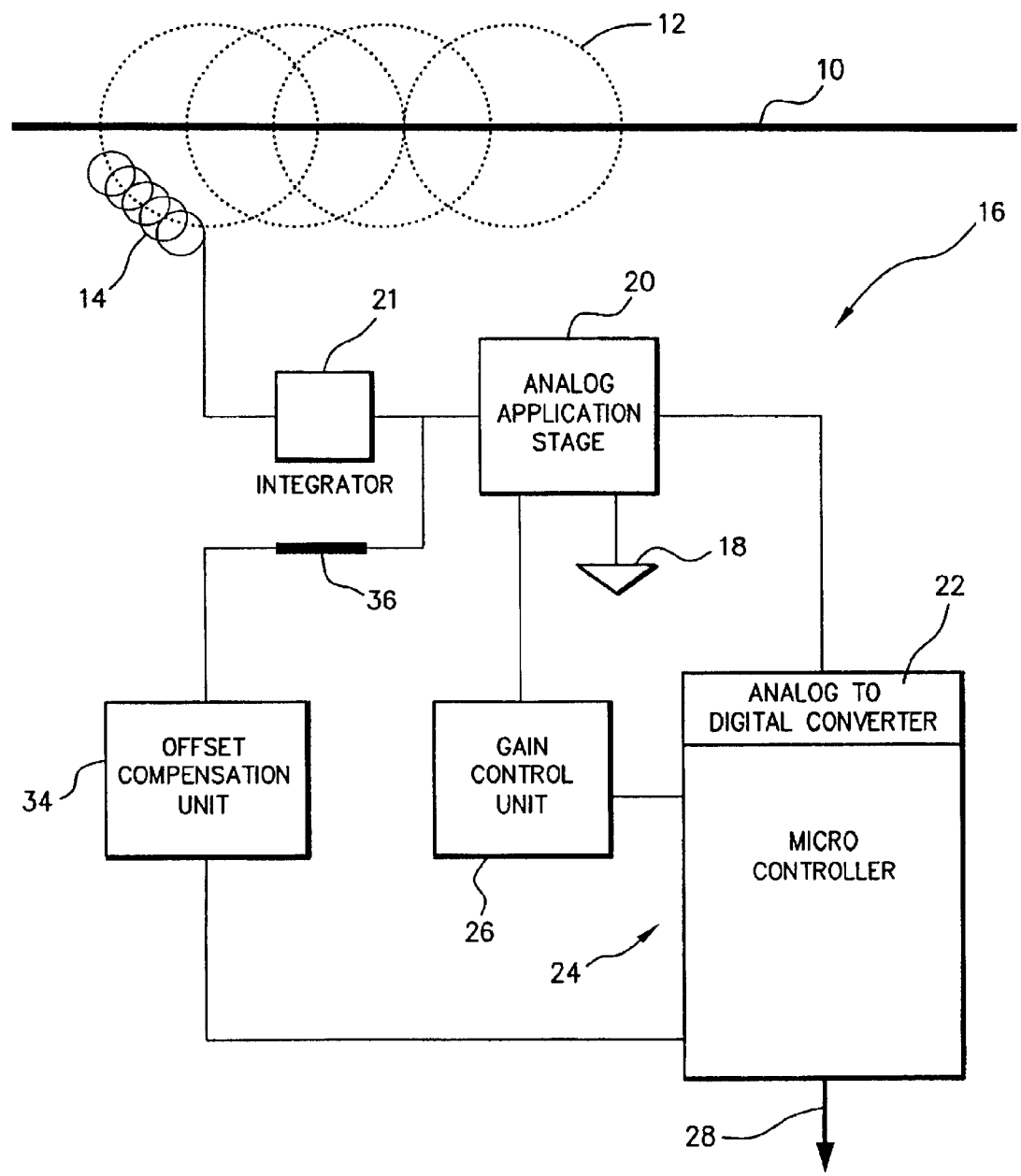
FIG. 1 is a schematic diagram illustrating a device in accordance with one embodiment of the present invention.

In FIG. 1, an AC signal in a power line 10 generates a magnetic field 12 around the power line 10. A conductive coil 14 of the device 16 is placed in the vicinity of the power line 10 in a manner such that at least a portion of the magnetic field lines of the magnetic field 12 passes through the loops of the coil 14, thereby inducing an AC signal in the coil 14, which is connected to an internal ground 18 of the device 16 through an analogue amplification stage 20. An integrator 21 is provided before the amplification stage 20. In the analogue amplification stage 20, the AC voltage across the coil 14 is amplified and the amplified AC voltage signal is inputted into an analogue to digital converter 22 of a microcontroller 24.

The microcontroller 24 controls a gain control unit 26 which in turn controls the gain of the analogue amplification stage 20. When the microcontroller 24 detects that the amplitude of the converted AC voltage signal has reached a predetermined value, it generates a control signal to the gain control unit 26, in response to which the gain control unit 26 reduces the gain of the amplification stage 20. Thereby, saturation of the amplification stage 20 can be avoided and measurements can continue for higher AC voltage signals from the coil 14.

In the microcontroller 24, the converted AC voltage signal is correlated with the control signals sent to the gain control unit 26, and the control unit 24 generates an output signal 28 which is representative of waveform, which includes the amplitude, phase and harmonic content of the AC voltage signal in the coil 14, which is a measure for the alternating current signal in the power line 10.

Figure 2A:
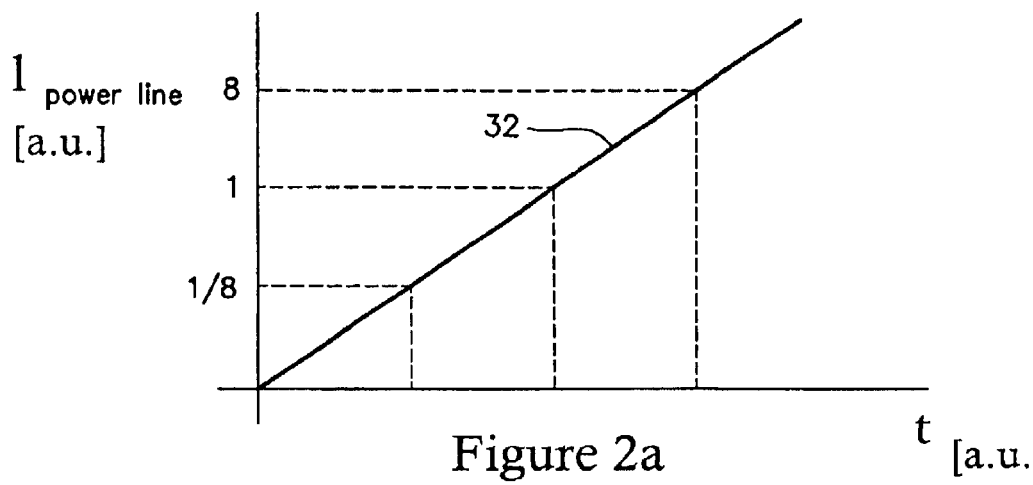
FIGS. 2a, b and c are graphs illustrating some characteristics of the device of FIG. 1.
Figure 2B:
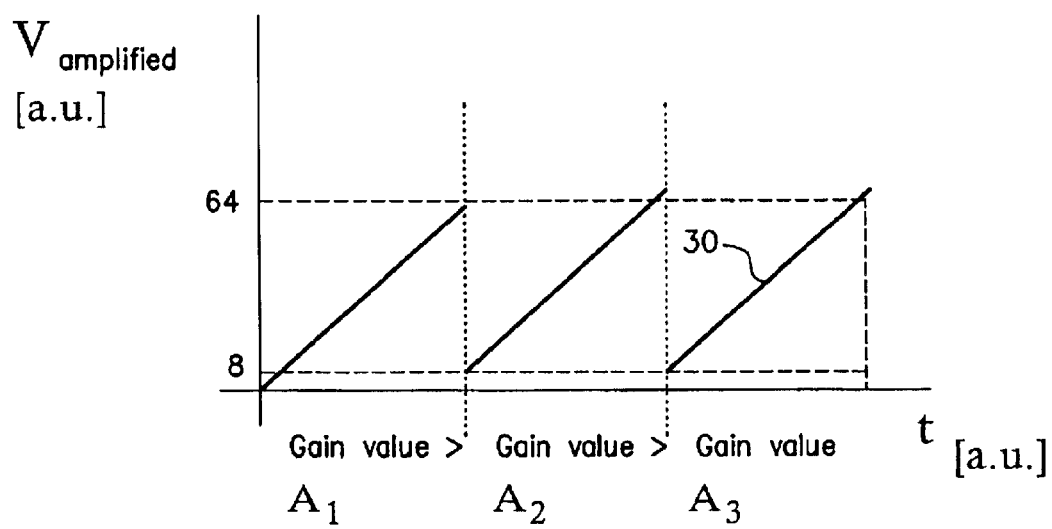
Figure 2C:
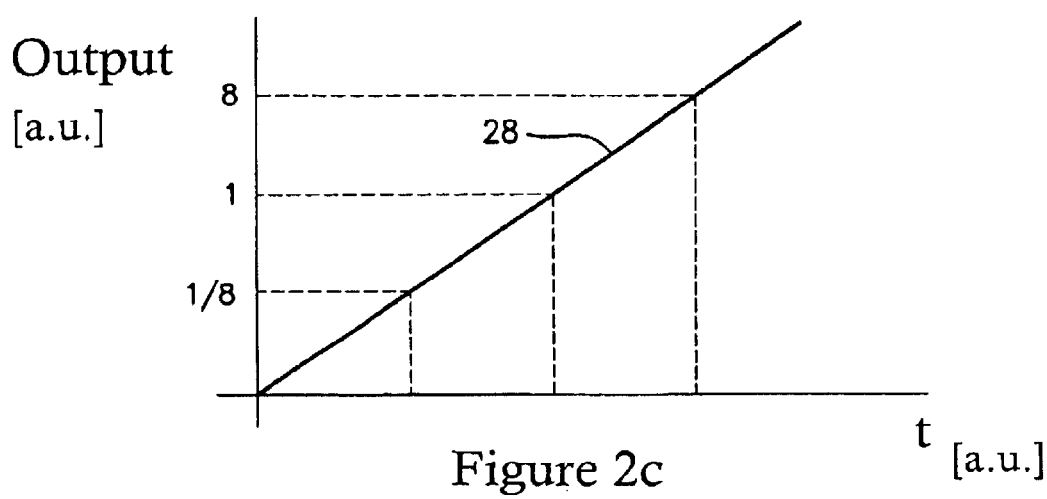

In FIGS. 2a to c, the output signal 28, the amplified voltage signal 30 and the amplitude of an AC signal 32 in the power line 10 are illustrated.

Referring again to FIG. 1, the device 16 further comprises an offset compensation unit 34. The offset compensation unit 34 receives a digital signal from the micro controller 24 representative of a DC component in the amplified AC voltage signal. The offset compensation unit 34 outputs a DC trimming signal which is added through a resistor 36 to the integrated AC voltage signal across the coil 14 at the input of the amplification stage 20.

Within the offset compensation unit 34, the amplitude of the generated DC trimming signal is varied to maintain the digital DC component signal received from the microcontroller 24 at a minimum. This corresponds to a fixed offset of the analogue signal entering the A/D converter 22. This can allow the amplification stage 20 to be operated at high gains without loss of performance caused by amplification of DC offset voltages.

Figure 3:
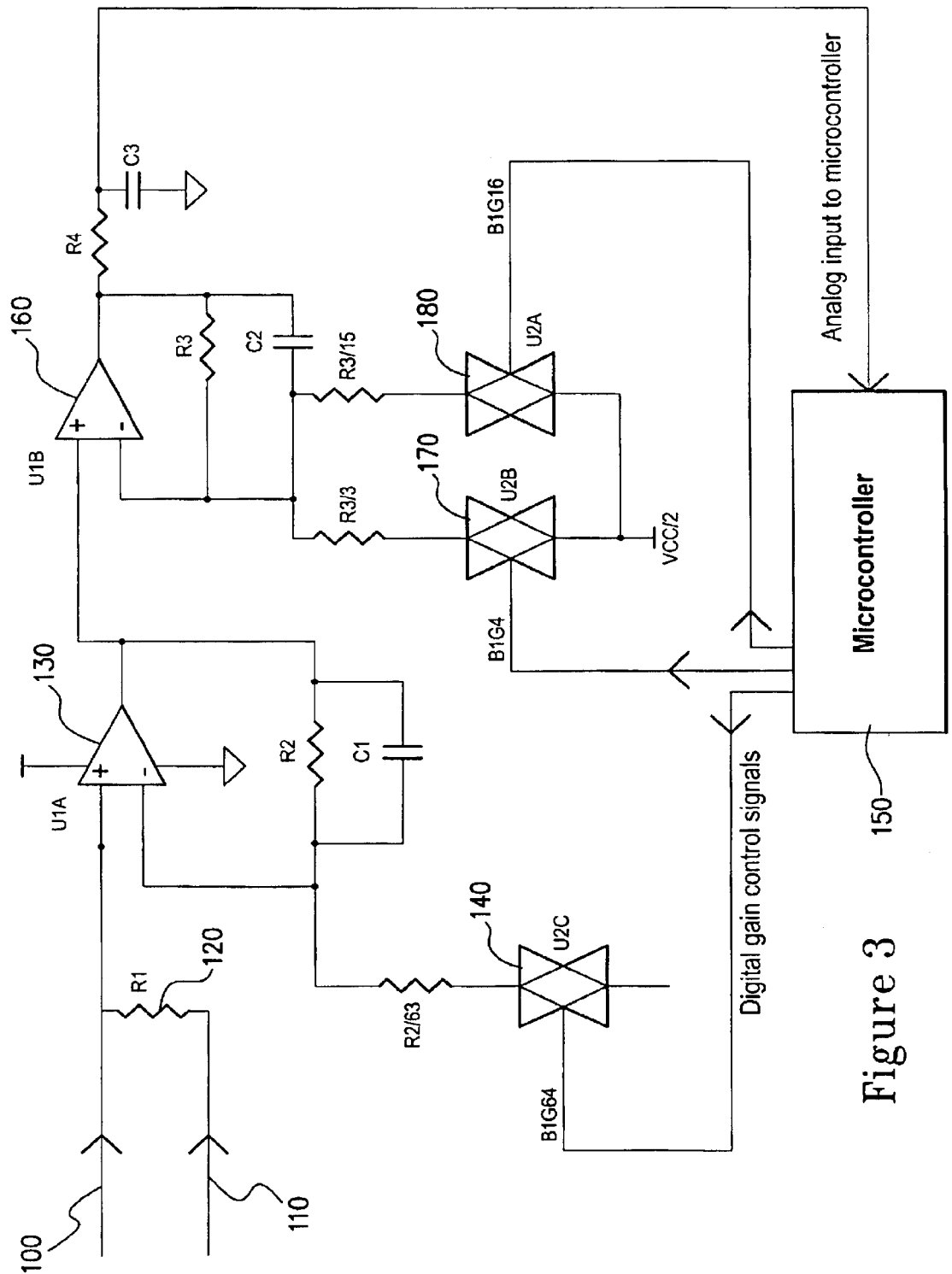
FIG. 3 is a circuit diagram showing a detail of a device in accordance with another embodiment of the present invention.

Turning now to FIG. 3, the input signal 100 and an offset correction signal 110 are added through resistor 120. This signal is applied to the non-inverting input of operational amplifier 130. The DC gain of amplifier 130 is equal to $$G\ 1\frac{R2}{R_{in}},$$

where $R_{in}$ is the input resistance between the inverting input of the amplifier and the reference voltage for the amplifier (VCC/2). Device 140 is a digitally controlled analog switch that is chosen to have an "off" resistance much higher than the resistor labelled R2/63. Similarly, the "on" resistance of the analog switch is chosen to be much less than the resistor labelled R2/63. Thus, when a control signal from the microcontroller 150 is activated, 140 is switched "ON", its resistance is low, so the DC gain of the amplifier 130 is given by $$G\left|1\frac{R2}{R2/63}\ 1\ 63\ 64.\right.$$

When device 140 is switched "OFF", its resistance is high, so the DC gain of the amplifier is given by $$G\left|1\frac{R2}{\phi}\ 1\ 0\ 1.\right.$$

Thus, the activation signal from the microcontroller 150 is used to set the DC gain of the amplifier 130 to either 64 or 1. Capacitors C1 and C2 are small value devices and are used to filter out ringing in the output signal following a gain change. the microcontroller 150 is used to set the DC gain of the amplifier 130 to either 64 or 1. Capacitor C1 is a small value device and is used to filter out ringing in the output signal following a gain change.

Amplifier 160 amplifies the signal from amplifier 130 and has gains set by R3, R3/3, R3/15, switch 170, and switch 180. The gains of this stage are shown below:

| Signal labelled B1G16 | Signal labelled B1G4 | Gain of Amplifier 160 |
|---|---|---|
| 0 | 0 | 1 |
| 0 | 1 | 4 |
| 1 | 0 | 16 |

By combining the gains of amplifiers 130 and 160, the following gain settings are possible:

| Signal labelled B1G64 | Signal labelled B1G16 | Signal labelled B1G4 | Gain (total) |
|---|---|---|---|
| 0 | 0 | 0 | 1 |
| 0 | 0 | 1 | 4 |
| 0 | 1 | 0 | 16 |
| 1 | 0 | 0 | 64 |
| 1 | 0 | 1 | 256 |
| 1 | 1 | 0 | 1024 |

The resistor R4 and capacitor C3 are used to lowpass filter the signal prior to the analog to digital converter in the microcontroller.

Figure 4:
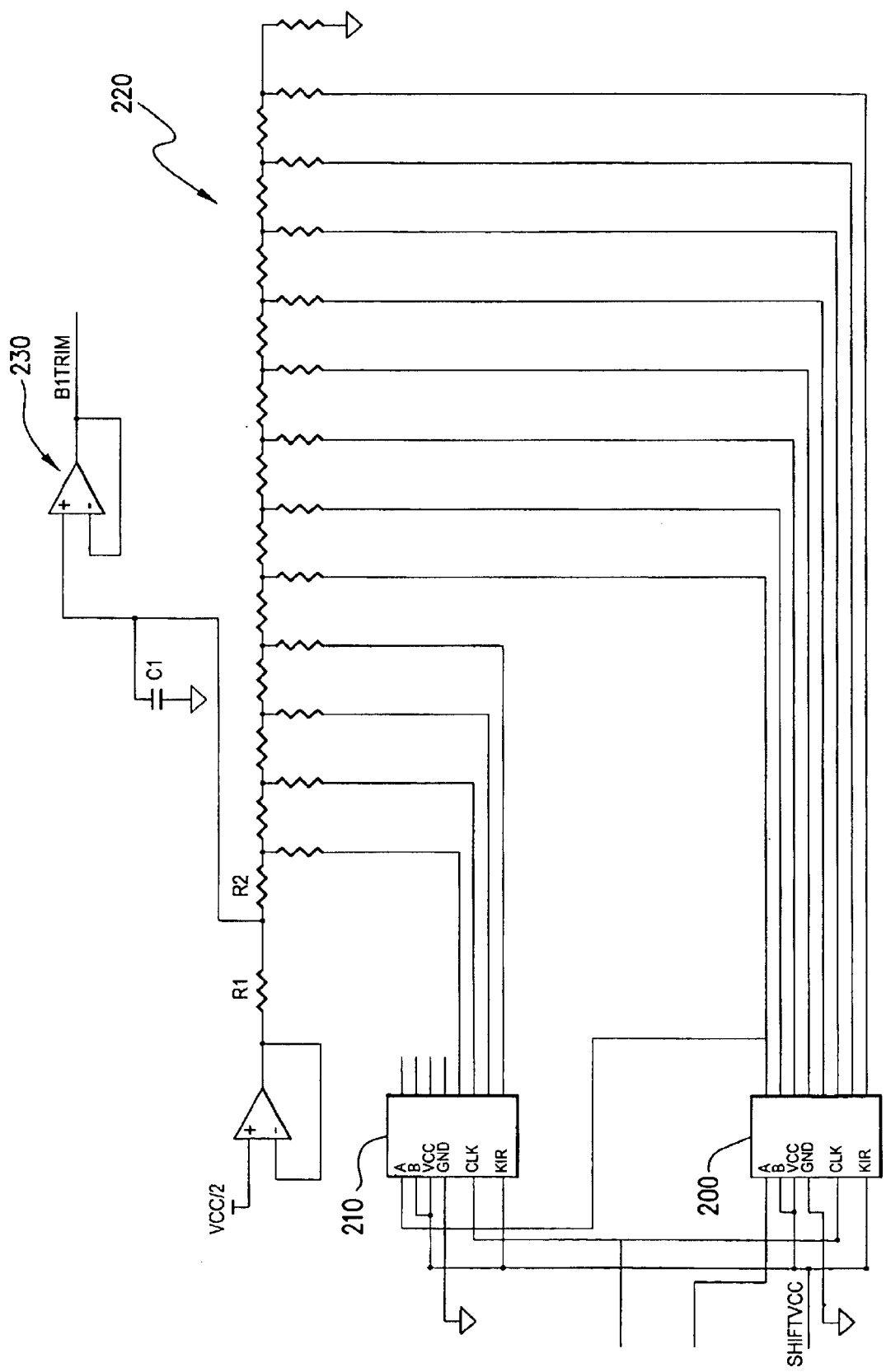
FIG. 4 is a circuit diagram showing another detail of the embodiment of FIG. 3.

Turning now to FIG. 4, the circuitry described below provides a technique to digitally correct for offset voltage in low cost, low power operational amplifiers. This allows the amplifiers to be operated at high gains without loss of performance caused by amplification of offset voltages.

Circuit Operation:

Devices 200 and 210 are serial to parallel shift registers. The most significant bit of shift register 200 is named D7 and is connected to the input of shift register 210. This gives a twelve digital output D0–D11. The inputs to the shift register (200+210) are generated by the microcontroller and are labelled DACDATA and DACCLK. These outputs are connected to the R-2R resistor network 220 to form a digital to analog converter. The output range of this digital to analog converter is from zero to (4095/4096) (SHIFTVCC), when SHIFTVCC is a predetermined DC signal. The output of the digital to analog converter is attenuated by resistor R1 and R2 and added to voltage VCC/2 to give a small voltage that varies around VCC/2. This voltage is filtered by C1 and buffered by buffer 230 to give signal B1TRIM.

The trimming software functions by setting the amplifier circuit shown in FIG. 3 to maximum gain. In the presence of a low input signal, the value of B1TRIM that minimises the DC offset voltage seen by the microcontroller 150 is obtained using a binary search technique.

Returning now to FIG. 1, the microcontroller 24 also performs an analysis of the frequency components of the amplified AC voltage signal, and thus of the frequency components of the magnetic field 12.

A lowpass filter is used to provide a signal proportional to the amplitude of the mains frequency component of the magnetic field ($M_1$). A bandpass filter is used to provide a signal proportional to the second harmonic component of the magnetic field ($M_2$). If the ratio of $M_2/M_1$ exceeds a predetermined ratio, then the magnetic field signal is determined to be caused by magnetising inrush current.

Figure 5:
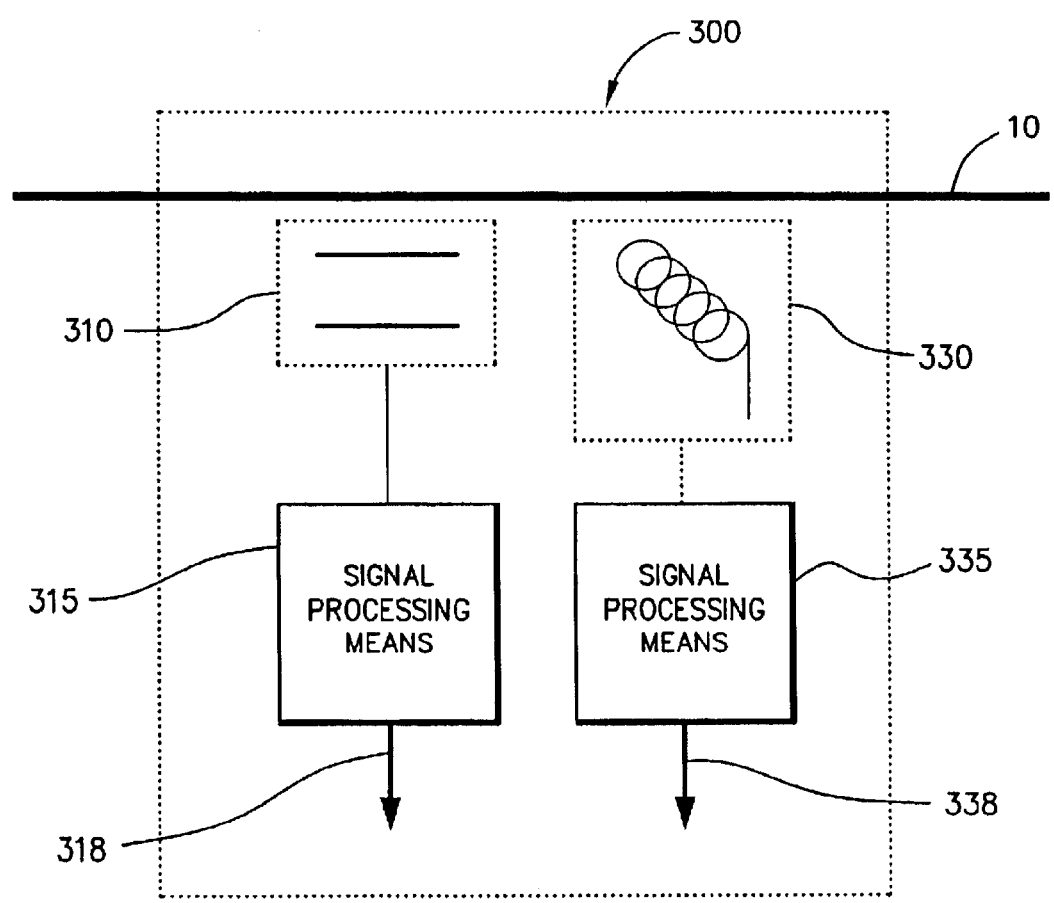
FIG. 5 is a schematic diagram illustrating a device in accordance with another embodiment of the present invention.

In FIG. 5, in another embodiment a device 300 further comprises a capacitor arrangement 310 for measuring the electric field generated by the AC voltage signal on the power line 10. Both the signal from the capacitor arrangement 310 and the coil arrangement 330 are processed substantially as described before for the embodiment incorporating only a coil for the measurement of magnetic fields. As such, signal processing means 315, 335 generate respective output signals 318, 338 from the respective capacitor arrangement 310 or coil arrangement 330. Similarly as for the magnetic field measurements, this results in an electric field measurement in which a value representing a parameter of the electric field can be determined on a "continuous" scale.

The device 300 allows the detection of a common but elusive type of fault, commonly called self-clearing fault. These faults are characterised by high levels of current but do not cause a trip. By measuring an increase or decrease in the magnitude of the electric field, accompanied by changes in the current, self-clearing faults may be detected and stored.

The device 300 incorporating the capacitor arrangement 310 for measuring the electric field can also be used to perform what is commonly referred to as a "distance to fault calculation".

Figure 6:
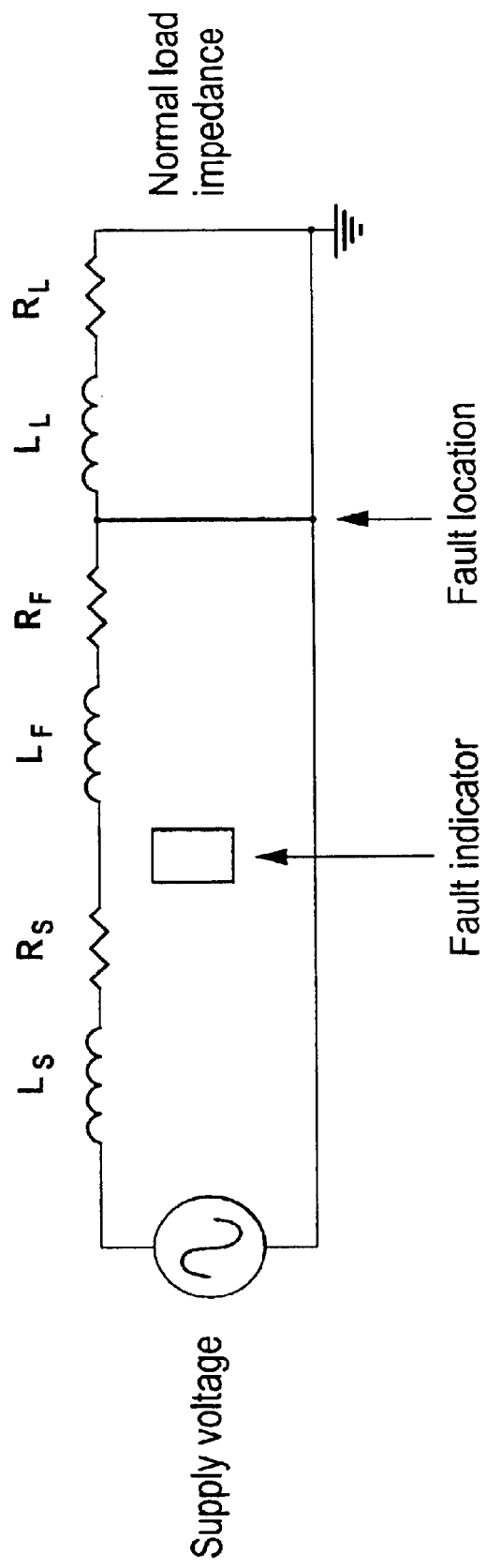
FIG. 6 is a schematic diagram illustrating a "distance to fault calculation" method.
Figure 7:
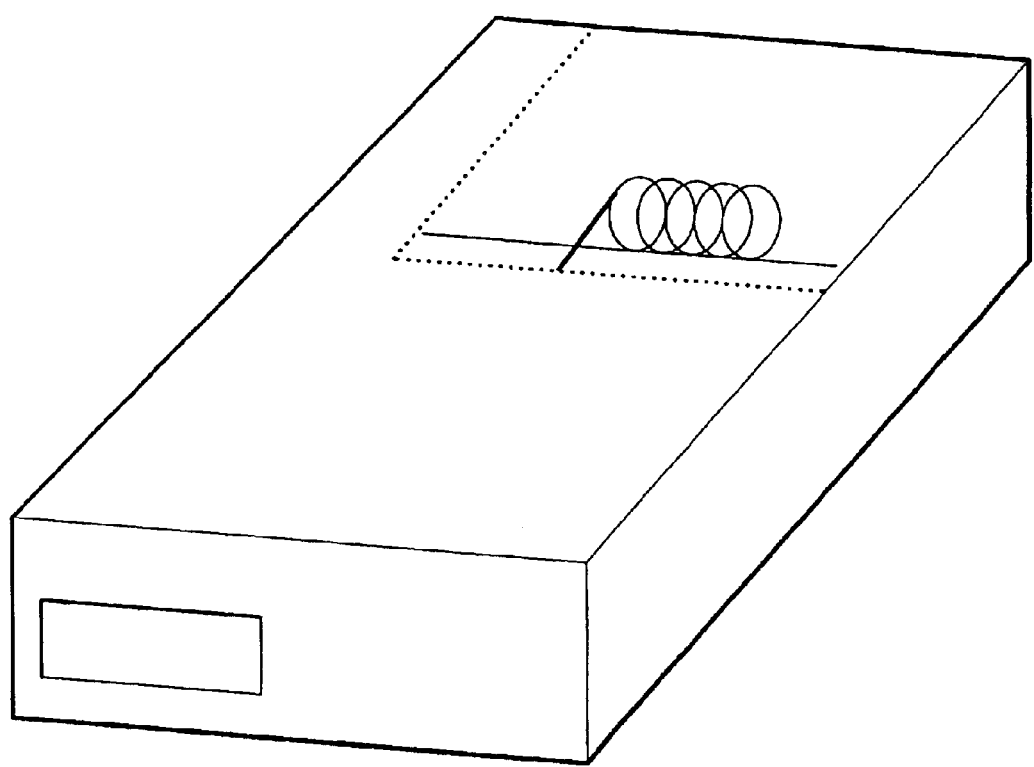
FIG. 7 is a schematic, perspective view of a device in accordance with another embodiment of the present invention.
Figure 8:
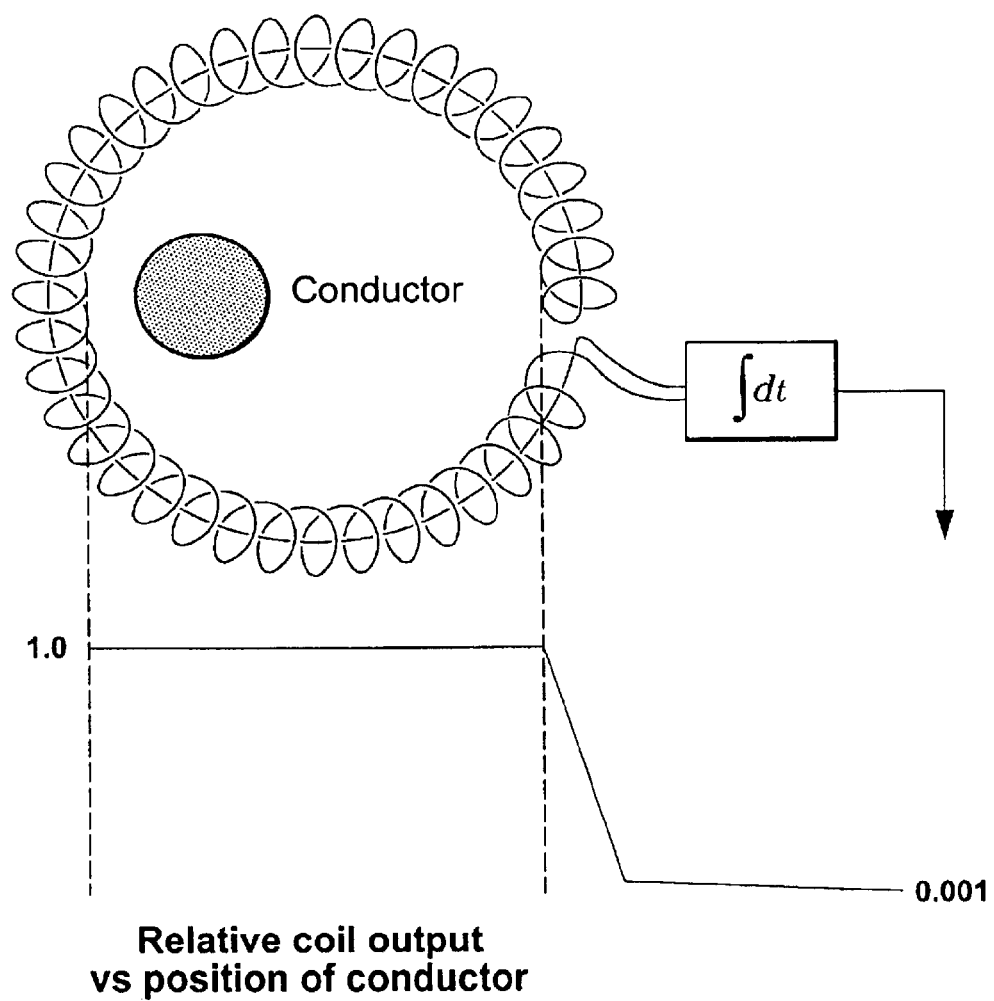
FIG. 8 is a schematic diagram of a coil for use in a method and/or a device in accordance with embodiments of the present invention.

Referring now to FIG. 6, the impedance of the line between the supply and the fault indicator is dominated by inductance $L_S$ and resistance $R_S$.

The impedance of the line between the fault indicator and the fault is dominated by inductance $L_F$ and resistance $R_F$.

The impedance of the line and load beyond the fault location is dominated by inductance $L_L$ and resistance $R_L$.

During the fault, it is assumed that the voltage at the fault is small compared to the supply voltage.

The voltage seen at the fault indicator is:

$$V_F = i_F R_F + L_F \frac{d i F}{d t}, \qquad 1.1$$

where iF is the fault current and $$\frac{d i F}{d t}$$

is the time derivative of the fault current.

If the voltage at the fault indicator is measured when iF is zero, then we have:

$$V_F = L_F \frac{d i_F}{d t} \bigg|_{iF=0}$$

Rearrangement gives $$L_F = V_F \frac{d t}{d i F} \bigg|_{iF=0} \qquad 1.2$$

Thus, we may calculate the inductance of the line between the fault indicator and the fault.

Now, the per/metre inductance of the line is a constant that varies little with the configuration or voltage of the line. Thus it is considered to be approximately constant for all lines. We may write:

$$L_F = k \times d,$$

where k is the inductance per metre and d is the length of the line in metres.

Similarly, we have:

$$d = \frac{L_F}{k}. \quad 1.3$$

Combining (1.2) and (1.3) gives $$d = \frac{V_F \frac{dt}{di_F}\big|_{i_F=0}}{k} \quad 1.4$$

Equation (1.4) is the basis for the distance to fault measurement technique. Note that this technique is used in other products.

If several devices incorporating electrical field measurements components are used, the distance to fault reported by each indicator may be used to refine the search for the location of the fault.

It will therefore be apparent from the above description that the preferred embodiments of the present invention provide a method or means to obtain within the memory of a microprocessor, fully scaled current and voltage wave forms which have not been rectified. This may be achieved without saturation or phase shift over a much greater dynamic range than was previously available. Also, preferred embodiments of the invention allow a user to establish multiple parameters of these waveforms which can then be used to base decisions on the presence of fault current. Each additional waveform parameter aids in the process deciding what is a fault current.

Currently available devices on the band are not able to cover the same dynamic range, maintain scaling, maintain the same level of waveform information, or combine the same range of waveform parameters in decision making. This is in par due to the available devices requiring rectification of the measured waveform.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

For example, it will be appreciated that the present invention is not limited to measurements performed on a single conductor, but rather the measurements could be conducted on a plurality of adjacent power lines. In such circumstances, one or more sensors (such as coil 14 of FIG. 1) could be used.

For example, it will be appreciated that the measurement may also be performed utilising two or more coils with an angular offset between them to establish the characteristics of the magnetic field.

The claims defining the invention are as follows:

1. A method for measuring at least one characteristic parameter of an alternating current in a conductor, the parameter of the alternating current comprising at least one of a group of waveform characteristics of the alternating current; phase of the alternating current; harmonic content of the alternating current; and a derivative of the alternating current, the method comprising the steps of:
   measuring a magnetic field around the conductor at a point along the conductor to obtain a measured magnetic field value;
   integrating the measured magnetic field value to thereby derive an analogue voltage signal representative of the magnetic field;
   adding a direct current (DC) offset signal to an alternating current (AC) component of the magnetic field;
   amplifying the analogue voltage signal;
   converting the amplified voltage signal into a digital voltage signal, the digital voltage signal being within a dynamic range of signal values;
   measuring the digital voltage signal including a DC component in the digital voltage signal, and when the amplitude of digital voltage signal reaches a predetermined value, adjusting a gain setting of the amplification to vary the dynamic range of signal values, and varying the DC offset signal in response to the measured DC component in the digital voltage signal;
   generating an output signal representative of the parameter of the alternating current based on the amplified voltage signal and the gain setting; and
   deriving a second analogue voltage signal representative of the measured electric field in the vicinity of the conductor;
   whereby in measuring the variance in the magnitude of the electric field generated by the conductor in conjunction with variance in the conductor, faults in the conductor may be detected.

2. A method as claimed in claim 1, further comprising the step of digitally filtering the digital voltage signal to determine the ratio of a mains voltage signal at a mains frequency of the conductor and a second harmonic of the mains frequency for determining whether a magnetic field signal around the conductor is caused by magnetizing inrush current.

3. A method as claimed in claim 1, wherein the step of measuring the electric field comprises the step of placing a capacitor arrangement in the vicinity of the conductor; and the method further comprises the steps of:
   amplifying the second analog voltage signal;
   converting the amplified second voltage signal into a second digital voltage signal;
   measuring the second digital voltage signal and, when the amplitude of the second digital voltage signal reaches a second predetermined value, adjusting a second gain setting of the amplification;
   and generating a second output signal representative of at least one parameter of a voltage signal in the conductor based on the amplified second voltage signal and the second gain setting.

4. An apparatus for measuring at least one characteristic parameter of an alternating current in a conductor, wherein the parameter of the alternating current comprises at least one of a group of waveform characteristics of the alternating current; phase of the alternating current; harmonic content of the alternating current; and a derivative of the alternating current, the apparatus comprising:
   measuring means for measuring a magnetic field around the conductor at a point along the conductor;
   integrating means for deriving an analogue voltage signal representative of the measured magnetic field;
   trimming means for providing a DC offset signal to an AC component of the measured magnetic field;
   amplification means for amplifying the analogue voltage signal;
   converting means for converting the amplified voltage signal into a digital voltage signal, wherein the digital voltage signal is within a dynamic range of signal values;

gain control means for adjusting a gain setting of the amplification depending on the amplitude of the digital voltage signal, wherein the dynamic range of signal values is varied;

second trimming means for providing a second DC offset of the amplification means;

means for generating an output signal representative of the parameter of the alternating current based on the amplified voltage signal and the gain setting;

second measuring means for measuring an electric field in the vicinity of the conductor; and second integrating means for deriving a second analogue voltage signal corresponding to the measured electric field in the vicinity of the conductor;

wherein by measuring the variance in the magnitude of the electric field in conjunction with the variance in current, faults in the conductor may be detected.

5. An apparatus as claimed in claim 4, the apparatus further comprising filtering means for filtering the digital signal and means for determining the ratio of a mains voltage signal at a mains frequency of the conductor and a second harmonic of the mains frequency to determine whether a magnetic field signal around the conductor is caused by magnetizing inrush current.

6. An apparatus as claimed in claim 4, the apparatus further comprising:

second amplification means for amplifying the second analog voltage signal;

second converting means for converting the second amplified voltage signal into a second digital voltage signal;

second gain control means for adjusting a second gain setting of the second amplification depending on the second digital voltage signal;

and a second means for generating an output signal representative of at least one parameter of a voltage signal in the conductor based on the second amplified voltage signal and the second gain setting.

7. An apparatus as claimed in claim 4, wherein the first and/or the second trimming means each comprise a serial to parallel shift register, wherein the outputs of the shift register are connected to a resister network to form a digital to analogue converter.

* * * * *